United States Patent
Cho et al.

(10) Patent No.: US 10,271,455 B2
(45) Date of Patent: Apr. 23, 2019

(54) AIRFLOW MANAGEMENT IN AN INFORMATION HANDLING SYSTEM (IHS) CHASSIS

(71) Applicant: Dell Products, L.P., Round Rock, TX (US)

(72) Inventors: Shih-Huai Cho, New Taipei (TW); Benson Lee, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/709,060

(22) Filed: Sep. 19, 2017

(65) Prior Publication Data

US 2019/0090382 A1    Mar. 21, 2019

(51) Int. Cl.
*H05K 7/20* (2006.01)
*G06F 1/18* (2006.01)
*G06F 1/20* (2006.01)

(52) U.S. Cl.
CPC ......... *H05K 7/20145* (2013.01); *G06F 1/182* (2013.01); *G06F 1/183* (2013.01); *G06F 1/20* (2013.01); *H05K 7/20727* (2013.01)

(58) Field of Classification Search
CPC ... G06F 1/20; H05K 7/20136–7/20145; H05K 7/20181; H05K 7/20718–7/20736
USPC ................ 361/679.49–679.51, 695; 454/184
See application file for complete search history.

(56) References Cited

U.S. PATENT DOCUMENTS

| | | | |
|---|---|---|---|
| 7,646,601 B2* | 1/2010 | Zhang | G06F 1/181 174/17 R |
| 7,843,683 B2* | 11/2010 | Suffern | H05K 7/20727 361/679.46 |
| 8,305,756 B2* | 11/2012 | Regimbal | H05K 7/2019 361/695 |
| 8,982,554 B2* | 3/2015 | Stewart | H05K 7/20145 312/223.2 |
| 2009/0154114 A1* | 6/2009 | Peng | G06F 1/182 361/728 |
| 2009/0168328 A1* | 7/2009 | Peng | H05K 7/1487 361/679.46 |
| 2015/0142939 A1* | 5/2015 | Petrick | H04L 41/0813 709/223 |
| 2015/0208543 A1* | 7/2015 | Chen | H05K 7/1489 361/679.39 |

* cited by examiner

*Primary Examiner* — Zachary Pape
(74) *Attorney, Agent, or Firm* — Fogarty LLP (57) ABSTRACT

Systems and methods for airflow management in an Information Handling System (IHS) chassis are described. In some embodiments, an air shroud may include a frame configured to be coupled to a rear portion of a sled insertable into a chassis of an IHS, a first flapper coupled to the frame via a first spring. and a second flapper coupled to the frame via a second spring.

14 Claims, 8 Drawing Sheets

AIRFLOW MANAGEMENT IN AN INFORMATION HANDLING SYSTEM (IHS) CHASSIS

FIELD

The present disclosure generally relates to Information Handling Systems (IHSs), and, more particularly, to systems and methods for airflow management in an IHS chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A chassis is a mechanical rack or enclosure capable of providing shared power, networking, and/or management infrastructure to a plurality of IHS components, such as server blades, input/output (I/O) modules, storage devices, etc. In some cases, IHS components may be mounted on a Printed Circuit Board (PCB) and/or coupled to a tray, and the inserted into a chassis using a carrier mechanism known as a drawer or sled. The carrier mechanism allows the tray and/or PCB to slide in and out of the chassis without completely removing the sled from the chassis, and without otherwise opening the chassis.

Multiple (or all) sleds in a chassis can also share the same cooling system. For example, a chassis may include fans that, in operation, move outside, ambient air from the front-end to the back-end of the chassis. Air is then expelled at a higher temperature than it comes in, after exchanging heat with the chassis internal components, therefore cooling those components.

The inventors hereof have determined, however, when a sled is drawn out from a chassis for service, for example, that "pulled out" (or sometimes "empty") sled creates an airflow bypass channel that is detrimental to the cooling of adjacent sleds. If the service time for any given sled could be extended by reducing thermal concerns with respect to adjacent sleds, maintenance performance would improve. Accordingly, the inventors hereof have developed systems and methods for airflow management in an IHS chassis.

SUMMARY

Embodiments of systems and methods for airflow management in an Information Handling System (IHS) chassis are described. In an illustrative, non-limiting embodiment, an air shroud may include a frame configured to be coupled to a rear portion of a sled insertable into a chassis of an IHS, a first flapper coupled to the frame via a first spring, and a second flapper coupled to the frame via a second spring.

In various implementations, the first and/or second flappers may include one or more orifices. For example, one or more orifices in each flapper may be square-shaped orifices disposed in a 2×14 perforation matrix. The first spring may be configured to apply a first closing force to the first flapper, and the second spring may be configured to apply a second closing force to the second flapper.

The sled may be configured to hold a component, the component may be mounted on a tray having a connector, and the connector may be coupled to another connector of a backplane within the chassis when the tray is inserted into the sled. The tray may include a plurality of storage devices coupled thereto. The sled may include an extensible rail, and the storage devices may be removable from the sled by extending the extensible rail while the sled remains static with respect to the chassis. The tray may also include a bracket configured to oppose the first and second closing forces of the first and second springs, and open the first and second flappers when the tray is inserted into the sled by retracting the extensible rail.

In another illustrative, non-limiting embodiment, an chassis, may include: a body having a slot; and a sled inserted in the slot, where the sled includes a rear end coupled to an air shroud that faces a back portion of the IHS chassis, the air shroud further comprising: a frame configured to be coupled to the rear end; a first flapper coupled to the frame via a first spring; and a second flapper coupled to the frame via a second spring.

In yet another illustrative, non-limiting embodiment, an IHS may include: a chassis; a backplane coupled to the chassis; a sled insertable into a slot in the chassis, where the sled is coupled to an air shroud, the air shroud further comprising: a frame configured to be coupled to the rear end; a first flapper coupled to the frame via a first spring; and a second flapper coupled to the frame via a second spring.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Embodiments described herein comprise systems and methods for airflow management in an Information Handling System (IHS) chassis. These embodiments include a dynamic airflow management mechanism coupled to the sled. The mechanism includes an air flapper configured stay open while a tray is retracted into its sled and to remain closed when the tray is extended outward from the sled, while the sled remains coupled to the chassis.

When the sled is fully retracted, the air flapper is open and the cooling system within the chassis operates normally. When the sled is fully extended, the air flapper is fully closed, increasing the mechanical impedance that would otherwise result from an open airflow bypass channel. In some cases, the air flapper may include orifices distributed on its surface such that, when fully closed, the air flapper presents an impedance to the airflow bypass channel that is the same or approximately same as the impedance that would otherwise result if the tray were fully inserted into the sled.

In some cases, these systems and methods may mitigate the impact of airflow bypass to improve an adjacent sled's operating performance when the storage drawer is pulled out. Moreover, balancing the temperature of storage components, such as HDDs in particular, can extend the amount of time that a sled can remain extended for service.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, science, control, or other purposes. For example, an IHS may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, touchscreen and/or a video display. The IHS may also include one or more buses operable to transmit communications between the various hardware components.

Figure 1:
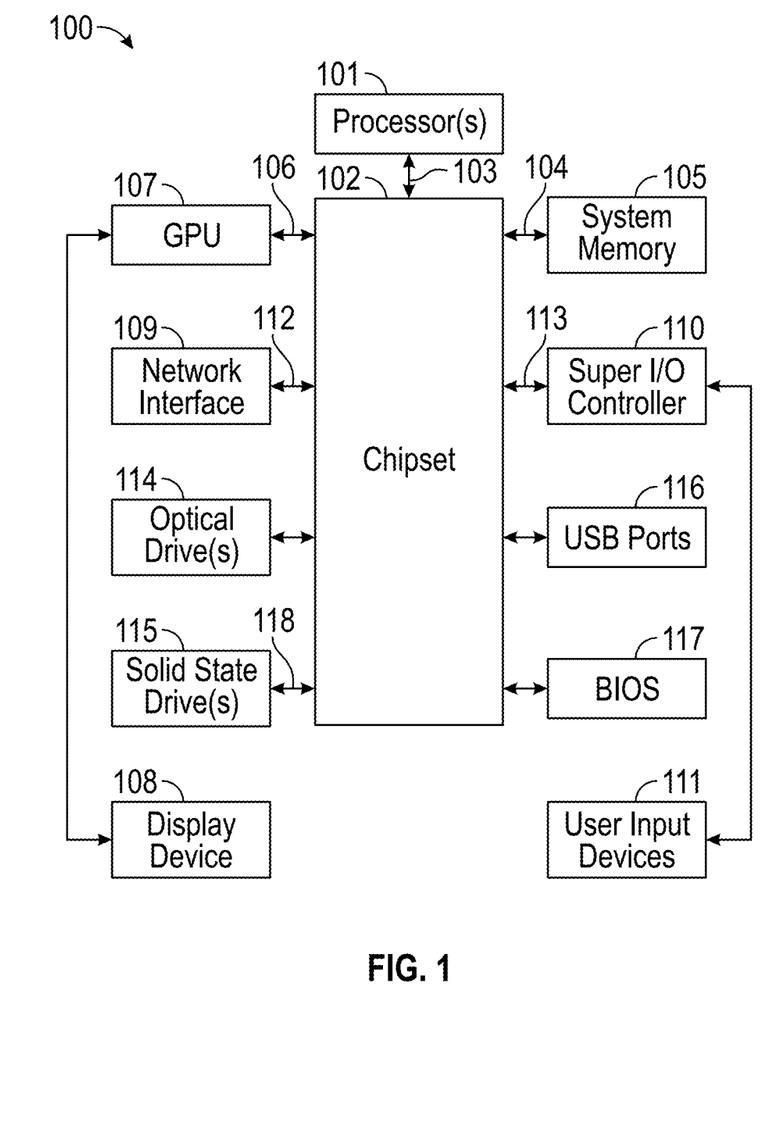
FIG. 1 shows a block diagram of examples of components of an Information Handling System (IHS), according to some embodiments.

FIG. 1 is a block diagram of examples of components of IHS 100. Particularly, IHS 100 includes one or more processor(s) 105 coupled to system memory 110 via system interconnect 115. System interconnect 115 may include any suitable system bus.

System memory 110 may include a plurality of software and/or firmware modules including firmware (F/W) 112, basic input/output system (BIOS) 114, operating system (O/S) 116, and/or application(s) 118. Software and/or firmware module(s) stored within system memory 110 may be loaded into processor(s) 105 and executed during operation of IHS 100.

IHS 100 includes one or more input/output (I/O) controllers 130, which support connection by and processing of signals from one or more connected input device(s) 132, such as a keyboard, mouse, touch screen, or microphone. I/O controllers 130 also support connection to and forwarding of output signals to one or more connected output devices 134, such as a monitor or display device, a camera, a microphone, or audio speaker(s) (not shown).

Additionally, one or more device interfaces 136, such as an optical reader, a universal serial bus (USB), a card reader, Personal Computer Memory Card International Association (PCMCIA) slot, and/or a high-definition multimedia interface (HDMI), may be included or coupled to IHS 100. Device interface(s) 136 are utilized to enable data to be read from or stored to removable storage device(s) 138, such as a compact disk (CD), digital video disk (DVD), flash drive, or flash memory card. Device interfaces 136 amy include General Purpose I/O interfaces such as an Inter-Integrated Circuit ($I^2C$), a System Management Bus (SMBus), or Peripheral Component Interconnect (PCI) buses.

IHS 100 comprises Network Interface Device (NID) 140. NID 140 enables IHS 100 to communicate and/or interface with other devices, services, and components that are located externally to IHS 100. These devices, services, and components can interface with IHS 100 via an external network, such as network 150, which may include a local area network, wide area network, personal area network, the Internet, etc.

IHS 100 further includes two or more PSUs 160A-N. PSUs 160A-N are coupled to BMC 175 via an $I^2C$ bus. BMC 175 enables remote operation control of PSUs 160A-N and other components within IHS 100. PSUs 160A-N powers the hardware components of IHS 100 (i.e., processor(s) 105, system memory 110, non-volatile storage 125, NID 140, I/O CTL(s) 130, etc.). To assist with maintaining temperatures within specifications, an active cooling system, such as fan 170, may be utilized.

BMC 175 may be configured to provide out-of-band management facilities for management of information handling system 100. Such management may be made by BMC 175 even if IHS 100 is powered off, or powered down to a standby state. BMC 175 may include a processor, memory, an out-of-band network interface separate from and physically isolated from an in-band network interface of IHS 100, and/or other embedded resources.

In certain embodiments, BMC 175 may include or may be an integral part of a Baseboard Management Controller (BMC) or a Remote Access Controller (e.g., a DELL Remote Access Controller or an Integrated DELL Remote Access Controller). In other embodiments, BMC 175 may include or may be an integral part of a Chassis Management Controller (CMC).

Figure 2:
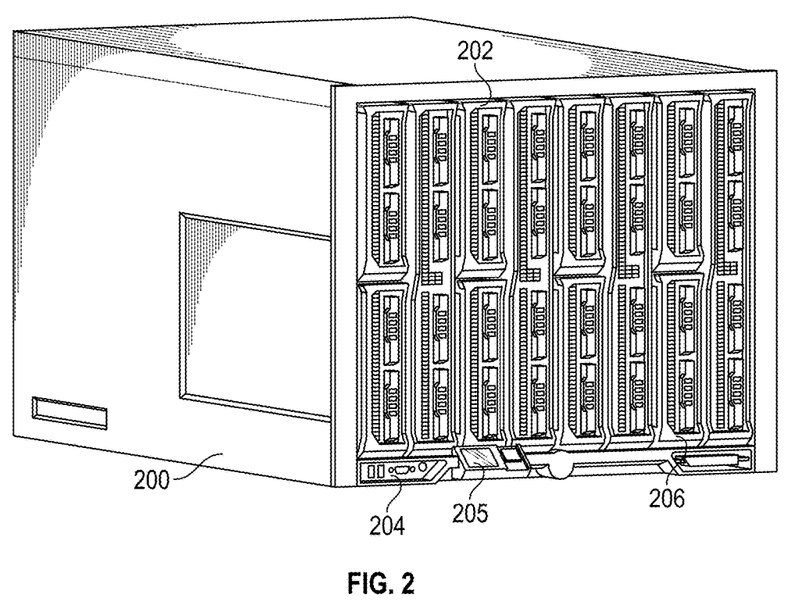
FIG. 2 shows an elevation view of an example of an IHS chassis, according to some embodiments.

FIG. 2 shows the front end of an example of chassis 200. In some embodiments, chassis 200 is configured to house a plurality of components, including one or more of components of IHS 100. For example, a plurality of storage devices may be mounted on a PCB or tray, and the tray may be inserted into sleds 202 or 203 and/or otherwise fastened thereto.

Sleds 202 or 203 are mechanically extensible, for example, using telescopic rails, thus providing access to all storage devices upon pulling of the PCB or tray from the sled. Sleds 202 or 203 may themselves be fixedly coupled to chassis 200 with fasteners. Apart from their respective telescopic rails rotatable or translatable parts, sleds 202 and 203 remain static with respect to chassis 200 as the tray is inserted into, or removed from, sleds 202 and 203.

In some cases, chassis 200 may include display 205 and I/O connectors 204. Display 205 may provide certain status and configuration information regarding the sled or its various components, whereas I/O connectors 204 may include ports and interfaces such as Universal Serial Bus (USB), audio, video, serial, parallel, Ethernet, etc. that enable a user to interact with the sled.

In some implementations, the various modules and components of FIG. 1 may be inserted or removed from chassis 200 while chassis 200 is running or turned on ("hot swapping"). In various configurations, chassis 200 may hold any number of sleds, and each sled may hold any number of storage devices or the like. It should be noted, however, that chassis 200 is described for sake of illustration only, and that many variations (e.g., number of components, distribution of components, etc.) may be present in other sleds.

Chassis 200 may also include a backplane or midplane configured to perform internal connections among various elements within chassis 200. For example, in some cases, communications between inserted components (e.g., housed by sleds 202 and 203) or other modules may be performed via a backplane or midplane. The backplane or midplane may also include a PCB (e.g., a "motherboard") or the like, with electrically conductive traces effecting connections between the respective pins of corresponding connectors.

Figure 3:
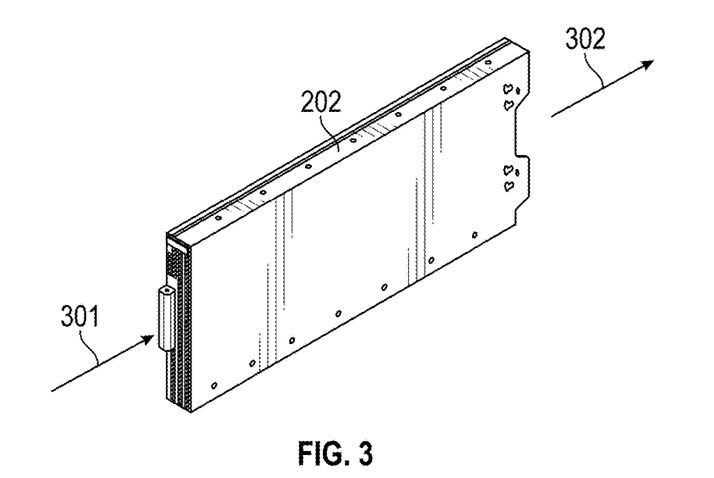
FIGS. 3 and 4 show different views of the sled in its retracted and extended positions, respectively, according to some embodiments.
Figure 4:
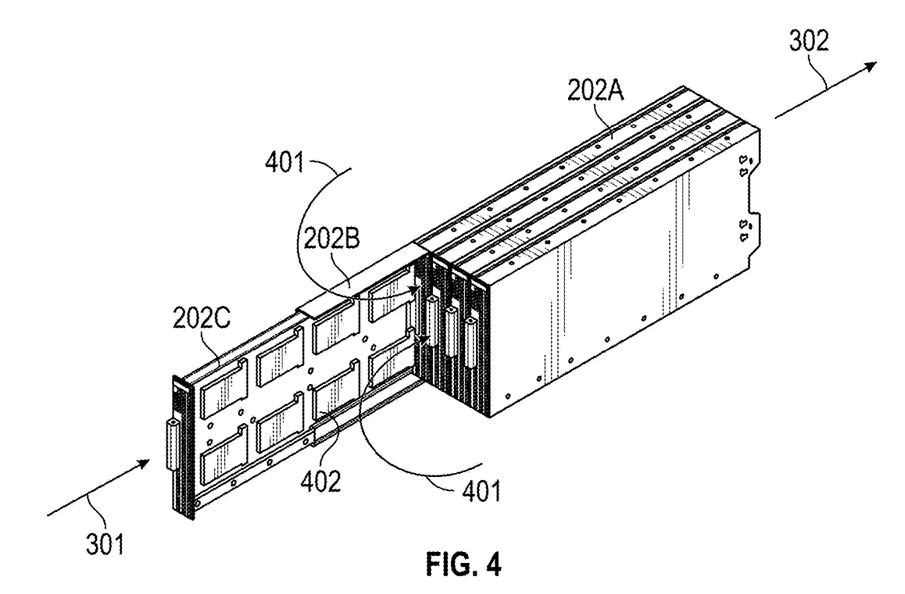

FIG. 3 shows sled 202 in a retracted position, and FIG. 4 shows sled 202 in an extended position. Chassis 200 is not shown for ease of visualization, but it is assumed from this point on that sled 202 has its body fastened or coupled to chassis 200. As illustrated, airflow intake 301 enters the front of sled 202, and airflow outlet 302 leaves the back of sled 202, when sled 201 is in the retracted position (inserted into chassis 200). This process reduces the operating temperature of IHS component 402 (e.g., one or more storage drives).

In FIG. 4, sled 202 is in its fully extended position. That is, rail portion 202B is fully pulled away from body portion 202A, and, after reaching its maximum travel distance, allows tray portion or PCB portion 202C to slide out and be removed from sled 202 (without having to unfasten or de-couple sled body 202A from chassis 200).

In a conventional chassis system, if telescopic rail system parts 202A-C were extended away from sled body 202A— this would allow airflow bypass channel 401 to be created unimpeded. Accordingly, to prevent airflow bypass channel 401 from forming and/or to control the mechanical impedance presented to airflow bypass channel 401 when sled 202 is extended, air flapper system 500 may be coupled to the rear portion of sled 202.

Figure 5:
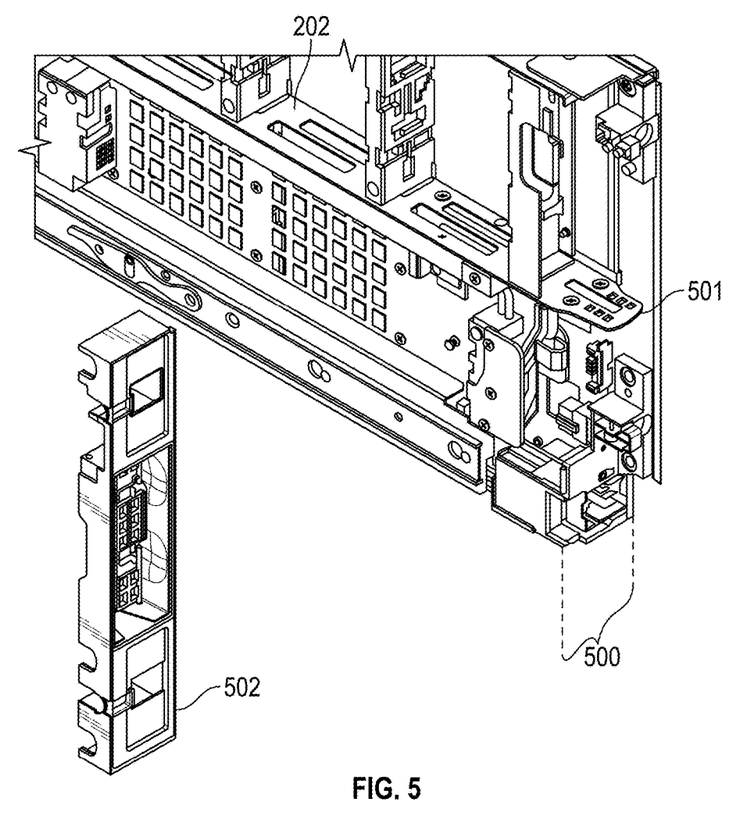
FIGS. 5 and 6 show different views of an air flapper system, according to some embodiments.
Figure 6:
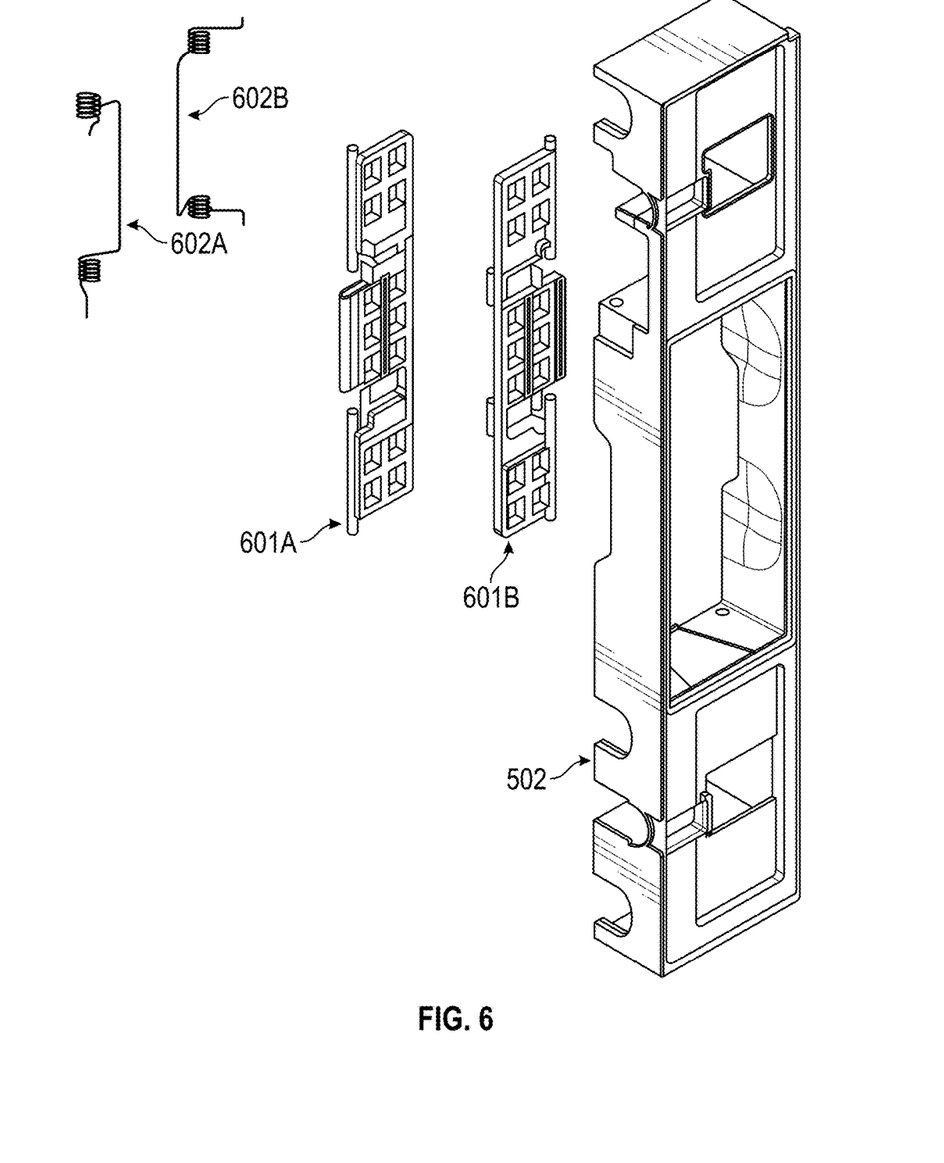
Figure 7A:
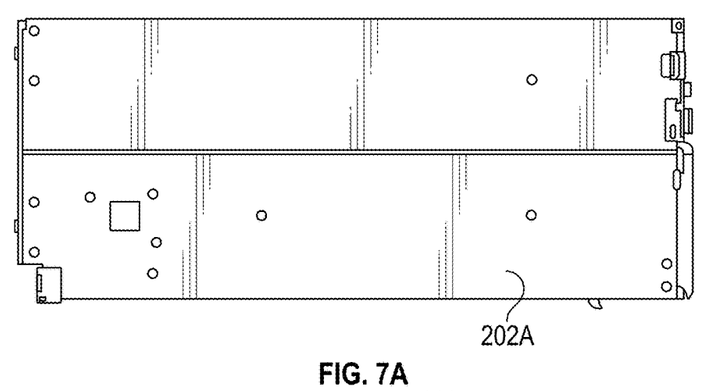
FIGS. 7A-D, 8A-D, and 9A-D show different views of the air flapper system in an open position, an intermediary position, and a closed position, respectively, according to some embodiments.
Figure 7B:
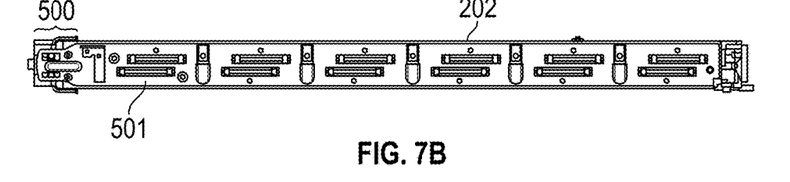
Figure 7C:
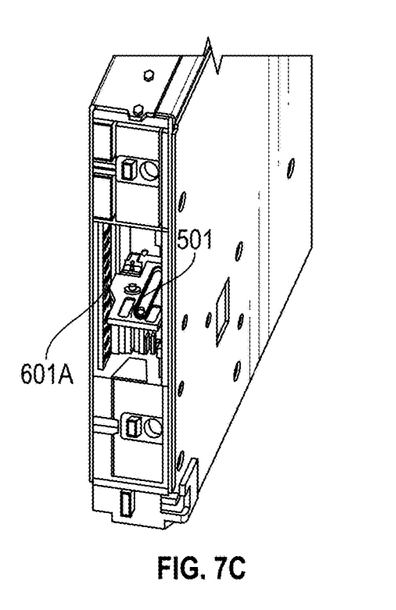
Figure 7D:
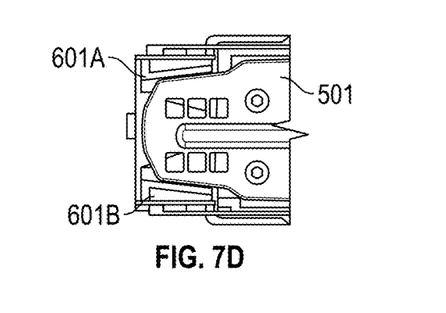
Figure 8A:
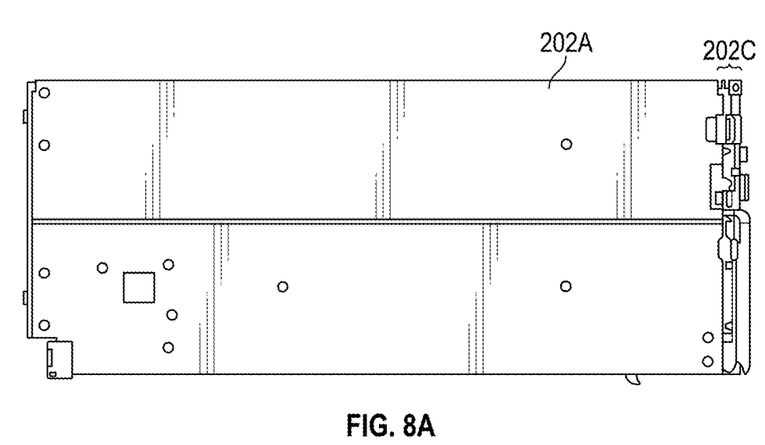
Figure 8B:
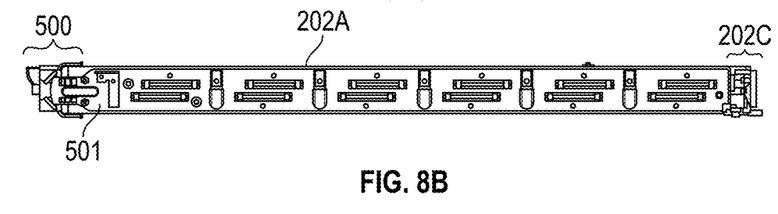
Figure 8C:
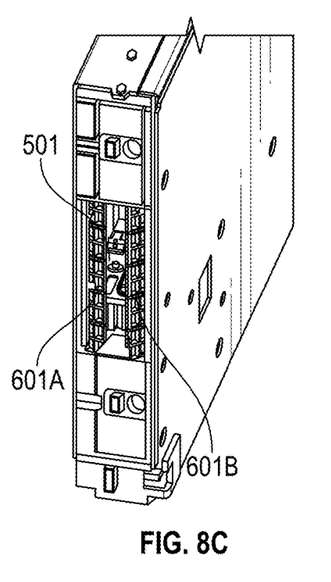
Figure 8D:
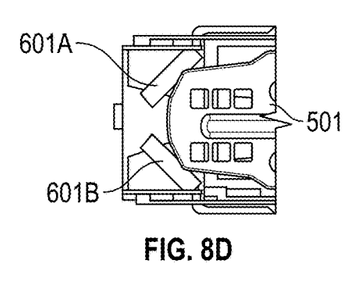
Figure 9A:
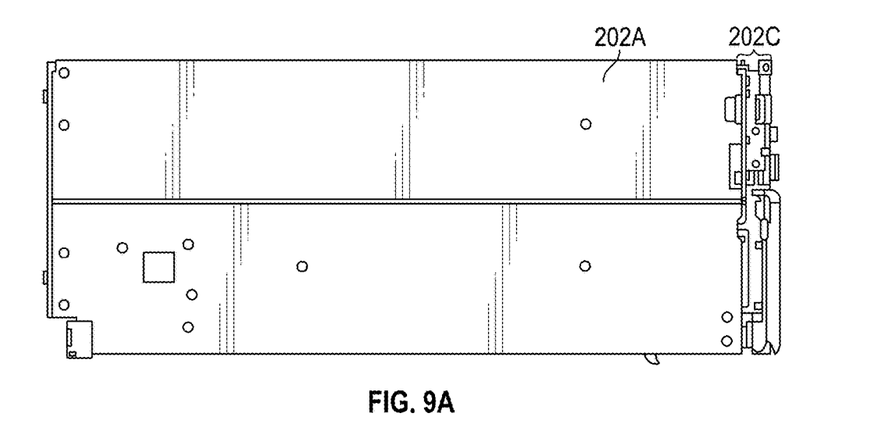
Figure 9B:
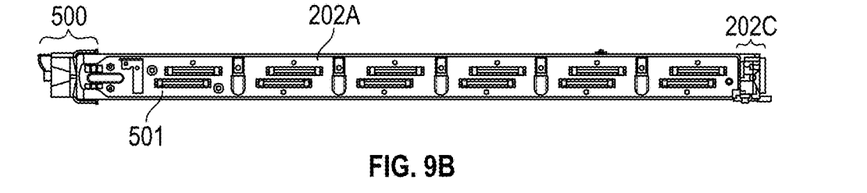
Figure 9C:
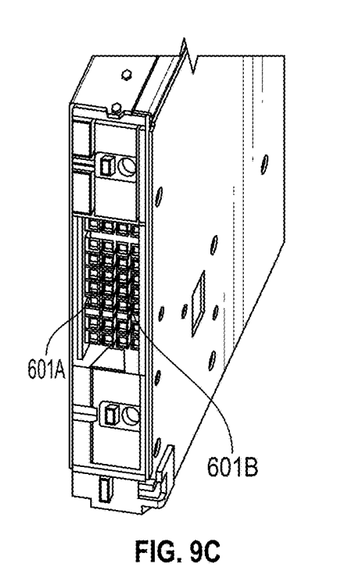
Figure 9D:
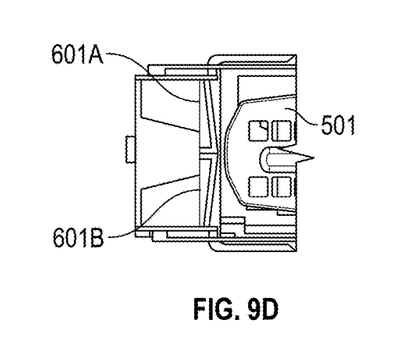

FIGS. 5 and 6 show different views of air flapper system 500 implemented in sled 202, according to some embodiments. As shown in FIG. 5, air flapper system 500 comprises (a) bracket 501, which has an approximately U-shaped extremity and may be fixedly coupled to tray or PCB 202C; and (b) frame portion 502, which provides mechanical support for various other components of FIG. 6, including: first flapper 601A coupled first spring 602B, and second flapper 601B coupled to second spring 602B. Each of components 601A-B and 602A-B may include protrusions and/or pins that allow them to hinge with respect to a longitudinal axis of frame portion 502.

To illustrate operation of air flapper system 500, FIGS. 7A-D show air flapper system 500 in a fully open position, FIGS. 8A-D show air flapper system 500 in an intermediary position, and FIGS. 9A-D show air flapper system 500 in a fully closed position. These various positions may be reached in sequence, as tray or PCB 202C is pulled away from seld body 202A, for example, to allow a user to service an IHS component mounted on the PCB.

The tray removal sequence starts at FIGS. 7A-D, where air flapper system 502 is still in an open position, such that first and second flappers 601A-B are parallel to each other, with bracket 501 pushing laterally against a closing force otherwise presented by loaded springs 602A-B. In FIGS. 8A-D, air flapper system 500 in an intermediary position with each of the first and second flappers 601A-B disposed at a 42° angle, as tray or PCB 202C continues to be pulled away from body 202A. Thereafter, as shown in FIGS. 9A-D, air flapper system 500 closes such that first and second flappers 601A-B are each at a 90° angle.

At this point, bracket 501 is no longer in contact with flappers 601A-B, and therefore springs 601A-B close the flappers all the way. In this case, bracket 501 loses contact with flappers 601A-B before rail 202B begins to shown extending (e.g., telescopically) from body 202A. In other embodiments, however, bracket 501 may lose contact with flappers 601A-B at any other time during removal of tray 202C from sled 202.

Typically, a conventional sled being drawn from a chassis can cause an 8° C. increase of a 195 W CPU located in an immediately neighboring sled. Using the systems and methods described herein, however, the impact of adjacent sled's CPU is about 1° C. only; an 87.5% improvement. As such, systems and methods described herein may mitigate the impact of airflow bypass to improve the adjacent sled's operating performance significantly when another storage drawer or tray is being pulled out.

In some implementations, a tray in a sled may have a number of components (e.g., an array of HDDs), and two or more components may be identified as having inferior performance (e.g., low read/write speeds) compared to the others components. The first components is identified as having a lower initial temperature but a higher heating rate, and the downstream components is classified as having a higher initial temperature but lower heating rate.

In this case, the perforating ratio (surface area vs. hole area) and/or geometry of the orifices in the individual flappers may be selected to increase maintenance time. As a person of ordinary skill in the art will recognize in light of this disclosure, better or optimal perforating configurations may be found by empirically without undue experimentation, for example, by selecting one among a set of different available flapper designs that results in the longest service time while the tray is pulled out.

When square-shaped orifices disposed in a 2×14 perforation matrix were used, the time it took for these components to reach their maximum operating specification of 55° C. improved by 13.7%, from approximately 220 s to approximately 250 s. As such, these systems and methods may be used for designing venting holes of air flappers for balancing internal sled temperatures, including selected subsets of IHS components, to thereby extend the service time when the storage drawer is pulled out from the sled.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements that such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An air shroud, comprising:
a frame configured to be coupled to a rear portion of a sled insertable into a chassis of an Information Handling System (IHS), wherein the sled includes an extensible rail, and wherein a Printed Circuit Board (PCB) coupled to a backplane within the chassis is removable from the sled by extending the extensible rail while the sled remains static with respect to the chassis;
a first flapper coupled to the frame via a first spring, wherein the first spring is configured to apply a first closing force to the first flapper; and
a second flapper coupled to the frame via a second spring, wherein the second spring is configured to apply a second closing force to the second flapper.

2. The air shroud of claim 1, wherein each of the first and second flappers includes one or more orifices.

3. The air shroud of claim 2, wherein the one or more orifices of each flapper are square-shaped orifices disposed in a 2×14 perforation matrix.

4. The air shroud of claim 1, wherein the sled is configured to hold a component, wherein the component is mounted on the PCB via a connector, and wherein the connector is coupled to another connector of the backplane when the PCB is inserted into the sled.

5. The air shroud of claim 4, wherein the PCB includes a plurality of storage devices coupled thereto.

6. The air shroud of claim 4, wherein the PCB includes a bracket configured to:
oppose the first and second closing forces of the first and second springs; and
open the first and second flappers when the PCB is inserted into the sled by retracting the extensible rail.

7. An Information Handling System (IHS) chassis, comprising:
a body having a slot; and
a sled inserted in the slot, wherein the sled includes a rear end coupled to an air shroud that faces a back portion of the IHS chassis, wherein the sled includes an extensible rail, and wherein a Printed Circuit Board (PCB) coupled to a backplane within the IHS chassis is removable from the sled by extending the extensible rail while the sled remains static with respect to the chassis, the air shroud further comprising:
a frame configured to be coupled to the rear end;
a first flapper coupled to the frame via a first spring, wherein the first spring is configured to apply a first closing force to the first flapper; and
a second flapper coupled to the frame via a second spring, wherein the second spring is configured to apply a second closing force to the second flapper.

8. The IHS chassis of claim 7, wherein each of the first and second flappers includes one or more orifices.

9. The IHS chassis of claim 7, wherein the one or more orifices of each flapper are square-shaped orifices disposed in a 2×14 perforation matrix.

10. The IHS chassis of claim 7, wherein the PCB further comprises an IHS component mounted thereto.

11. The IHS chassis of claim 7, wherein the PCB comprises a bracket configured to:
oppose the first and second closing forces of the first and second springs; and
open the first and second flappers as the component is inserted into the sled in response to a user retracting the extensible rail.

12. An Information Handling System (IHS), comprising:
a chassis;
a backplane coupled to the chassis;
a sled insertable into a slot in the chassis, wherein the sled includes an extensible rail, and wherein a Printed Circuit Board (PCB) coupled to the backplane is removable from the sled by extending the extensible rail while the sled remains static with respect to the chassis, and wherein the sled is coupled to an air shroud, the air shroud further comprising:
a frame configured to be coupled to the rear end;
a first flapper coupled to the frame via a first spring, wherein the first spring is configured to apply a first closing force to the first flapper; and
a second flapper coupled to the frame via a second spring, wherein the second spring is configured to apply a second closing force to the second flapper.

13. The IHS of claim 12, wherein the PCB is coupled to a bracket configured to oppose the first and second closing forces of the first and second springs upon contact with the first and second flappers when the PCB is inserted into the sled.

14. The IHS of claim 13, wherein the bracket is configured to control an amount of an opening between the first and second flappers as the PCB is partially inserted or removed from the sled.

* * * * *